(12) United States Patent
Lee et al.

(10) Patent No.: US 8,088,672 B2
(45) Date of Patent: Jan. 3, 2012

(54) PRODUCING A TRANSFERRED LAYER BY IMPLANTING IONS THROUGH A SACRIFICIAL LAYER AND AN ETCHING STOP LAYER

(75) Inventors: Tien-Hsi Lee, Taipei (TW); Ching-Han Huang, Bade (TW); Chao-Liang Chang, Sanchong (TW); Yao-Yu Yang, Taipei (TW)

(73) Assignee: Tien-Hsi Lee, Taipei (TW)

( * ) Notice: Subject to any disclaimer, the term of this patent is extended or adjusted under 35 U.S.C. 154(b) by 0 days.

(21) Appl. No.: 12/999,452

(22) PCT Filed: Jun. 20, 2008

(86) PCT No.: PCT/CN2008/001209
§ 371 (c)(1),
(2), (4) Date: Dec. 16, 2010

(87) PCT Pub. No.: WO2009/152648
PCT Pub. Date: Dec. 23, 2009

(65) Prior Publication Data
US 2011/0097873 A1    Apr. 28, 2011

(51) Int. Cl.
*H01L 21/30* (2006.01)
*H01L 21/00* (2006.01)

(52) U.S. Cl. ... 438/458; 438/459; 438/795; 257/E21.12; 257/E21.568

(58) Field of Classification Search ............... 438/458, 438/459, 795; 257/E21.12, E21.568
See application file for complete search history.

(56) References Cited

U.S. PATENT DOCUMENTS

| | | | |
|---|---|---|---|
| 5,374,564 A | 12/1994 | Bruel | |
| 5,882,987 A | 3/1999 | Srikrishnan | |
| 6,372,609 B1 | 4/2002 | Aga et al. | |
| 6,486,008 B1 * | 11/2002 | Lee | 438/149 |
| 2004/0137698 A1 * | 7/2004 | Taraschi et al. | 438/458 |
| 2005/0205930 A1 * | 9/2005 | Williams, Jr. | 257/347 |
| 2006/0177991 A1 | 8/2006 | Murakami et al. | |
| 2007/0207593 A1 * | 9/2007 | Couillard et al. | 438/455 |
| 2008/0038900 A1 * | 2/2008 | Thakur et al. | 438/455 |
| 2008/0113489 A1 * | 5/2008 | Akiyama et al. | 438/458 |

FOREIGN PATENT DOCUMENTS

| | | |
|---|---|---|
| CN | 1431717 | 7/2003 |
| CN | 1632911 | 6/2005 |
| CN | 1820354 | 8/2006 |
| CN | 101071767 | 11/2007 |

OTHER PUBLICATIONS

International Search Report for PCT/CN2008/001209 dated Mar. 26, 2009.

* cited by examiner

*Primary Examiner* — Kevin Parendo
(74) *Attorney, Agent, or Firm* — Stites & Harbison PLLC; Juan Carlos A. Marquez, Esq.

(57) ABSTRACT

A method for producing a thin film includes the following steps: providing a primary substrate; forming an etching stop layer on the primary substrate; forming a sacrificial layer on the etching stop layer; implanting gas ions to form an ion implantation peak layer, which defines an effective transferred layer and a remnant layer; and separating the effective transferred layer from the remnant layer. The thickness of the effective transferred layer can be effectively determined by controlling the thickness of the sacrificial layer. Moreover, the thickness of the effective transferred layer can be uniform and then the effective transferred layer can become a nanoscale thin film.

20 Claims, 10 Drawing Sheets

PRODUCING A TRANSFERRED LAYER BY IMPLANTING IONS THROUGH A SACRIFICIAL LAYER AND AN ETCHING STOP LAYER

CROSS-REFERENCE TO RELATED APPLICATIONS

This application is a 35 USC 371 application of PCT/CN 2008/001209 filed on Jun. 20, 2008, published as Pub. No. WO 2009/152648. The content of the specification is incorporated herein by reference.

BACKGROUND OF THE INVENTION

1. Technical Field

The present invention relates to a method for producing a thin film, and more particularly, to a method for forming a thin film on a substrate.

2. Description of Related Art

Silicon on insulator (SOI) is made essentially by providing an insulating layer beneath a silicon wafer, so as to avoid undesired electric effects, reduce power consumption and thereby lower current loss. Besides, SOI can increase the processing speed of an integrated circuit (IC). In addition to being applied to devices requiring lower power consumption, such as cell phones and watches, SOI is also finding applications in high frequency ICs to make the best use of its high-speed processing features.

SOI can be produced by several different methods, as described below in detail. In 1988, Dr. W. Maszara, who was based in the United States, used an etch stop layer to produce bond and etch-back silicon on insulator (BESOI) having a micron-scale film thickness. However, as the working time for the etch stop layer to stop etching varies at different points on a wafer, a thin film formed on the BESOI may exhibit undesirable total thickness variation (TTV). Moreover, BESOI involves a time-consuming manufacturing process that ends up with environment-unfriendly waste solutions, and in consequence the production cost of BESOI stays high.

About the same time, International Business Machines Corp. (IBM) produced SOI using a method called Separation by Implantation of Oxygen (SIMOX). Since the SOI produced by SIMOX showed better total thickness variation, BESOI almost became obsolete in applications related to highly integrated circuits.

In 1992, Dr. M. Bruel, who was based in France, invented a method for producing a thin film, better known as the Smart Cut® Process. With the Smart Cut® Process, a thin film having a sub-micron-scale film thickness can be successfully cut off from a substrate and transferred to another substrate. In addition, the Smart Cut® Process allows a thin film on BESOI to have a total thickness variation as low as a thin film made by SIMOX.

U.S. Pat. No. 5,374,564 discloses a method for producing a thin semiconductor material film. According to the method, a high dose of ions, such as gas ions of hydrogen or an inert gas, are implanted into a primary substrate to form an ion layer. Then, the primary substrate is bonded with a target substrate to form a single piece. A heating treatment follows, causing the gas ions in the ion layer to polymerize and generate numerous microbubbles. The microbubbles gradually unite into a whole and thereby partially separate the primary substrate into two layers. One of the separated layers of the primary substrate is transferred to the target substrate and thereby forms a thin film on the target substrate. The Smart Cut® Process not only produces a thin film having a low total thickness variation and a low defect density, but also generates no corrosive solution during the manufacturing process. Besides, gas dissipated from the Smart Cut® Process is neither toxic nor harmful, so there are no pollution problems. Moreover, the primary substrate can be recycled for further use.

In the Smart Cut® Process as well as in SIMOX, the thickness of a thin film on SOI is determined by an ion implantation depth, which, in turn, is controlled by an ion implantation energy. Since the Smart Cut® Process uses hydrogen ions, which have very light mass, the ion implantation depth cannot be easily reduced to nanoscale even with a lower ion implantation energy. As a result, it is difficult to achieve shallow implantation with a good ion distribution and produce a thin film of a uniform thickness. Furthermore, after a thin film is transferred to a target substrate using the Smart Cut® Process, it is still necessary to apply chemical polishing or oxide etching to decrease the thickness of the thin film to nanoscale. Thus, when it comes to a wafer having a large area, the accuracy and uniformity of thickness of a transferred thin film could be significantly impaired.

As for SIMOX, although oxygen ion implantation is used, wherein oxygen ions have heavier mass than hydrogen ions, and shallow implantation with a good ion distribution is achievable, so that an ultra-thin SOI film can be produced, the yield of components may be lowered by defects resulting from SIMOX, particularly oxygen precipitates generated by oxygen ion implantation, as semiconductor manufacturing processes enter the nanoscale era.

In order to achieve a desirable nanoscale thickness with the Smart Cut® Process, U.S. Pat. No. 5,882,987 discloses a method for producing a thin semiconductor film using the Smart Cut® Process, wherein an etch stop layer is grown on a primary silicon substrate, before an ultra-thin monocrystalline silicon layer is grown on the etch stop layer. Then, the Smart Cut® Process is employed to cut off a combined portion comprising the ultra-thin monocrystalline silicon layer, the etch stop layer and superfluous silicon beneath the etching stop layer from the primary silicon substrate, and transfer the combined portion to a target substrate.

Following that, a surface of the target substrate is etched so as to remove the superfluous silicon from the etch stop layer, so that all that remain on the target substrate are the ultra-thin monocrystalline silicon layer and the etch stop layer. After applying the method for making BESOI, an ultra-thin SOI wafer is finally produced, though unfortunately with a non-uniform film thickness.

In summary, while the Smart Cut® Process can be used to produce SOI, the lighter mass of hydrogen ions makes it difficult to achieve shallow implantation with a good ion distribution. Consequently, the transferred thin film is less likely to have a desired nanoscale film thickness. If the transferred thin film is to have a nanoscale film thickness, an additional thinning step is required, which, however, may considerably lower the accuracy and uniformity of the film thickness. Moreover, since a matching level of crystal lattices between the etch stop layer and the thin film is likely to affect film quality, product yield may drop as a result.

BRIEF SUMMARY OF THE INVENTION

The present invention relates to a method for producing a thin film, wherein, by providing a sacrificial layer on an etching stop layer and controlling a thickness of the sacrificial layer and an ion implantation energy, the implanted ions are allowed to define a very thin effective transferred layer, so as to achieve a nanoscale film thickness. Furthermore, the sacrificial layer has a function similar to filtering, so that impurity ions in the implanted ions can be filtered out. Thus, a thin film having a nanoscale uniform thickness can be produced by a relatively simple ion implantation device.

To achieve this end, the present invention provides a method for producing a thin film comprising the steps of: providing a primary substrate; forming an etching stop layer on the primary substrate; forming at least one sacrificial layer on the etching stop layer; implanting gas ions with an ion implantation technique, so that the gas ions are implanted from the sacrificial layer, then the etching stop layer is penetrated, and an ion implantation peak layer is formed in the primary substrate, thereby defining an effective transferred layer and a remnant layer, with the thickness of the effective transferred layer determined by the thickness of the sacrificial layer and the ion implantation energy used in the ion implantation technique; and separating the effective transferred layer from the remnant layer by applying an energy input treatment to polymerize the implanted gas ions, so that the effective transferred layer is separated from the remnant layer.

Implementation of the present invention provides at least the following advantageous effects:

1. A thin film having a nanoscale thickness can be produced;
2. The effective transferred layer can be smoothly peeled off without affecting a total thickness variation thereof; and
3. By virtue of the filtering feature of the sacrificial layer, impurity ions in the implanted ions can be filtered out, so that a thin film can be produced by a simple ion implantation device.

A detailed description of further features and advantages of the present invention is given below, so that a person skilled in the art is allowed to understand and carry out the technical contents of the present invention, and can readily comprehend the objectives and advantages of the present invention after reviewing the contents disclosed herein, the appended claims and the accompanying drawings.

DETAILED DESCRIPTION OF THE INVENTION

Figure 1:
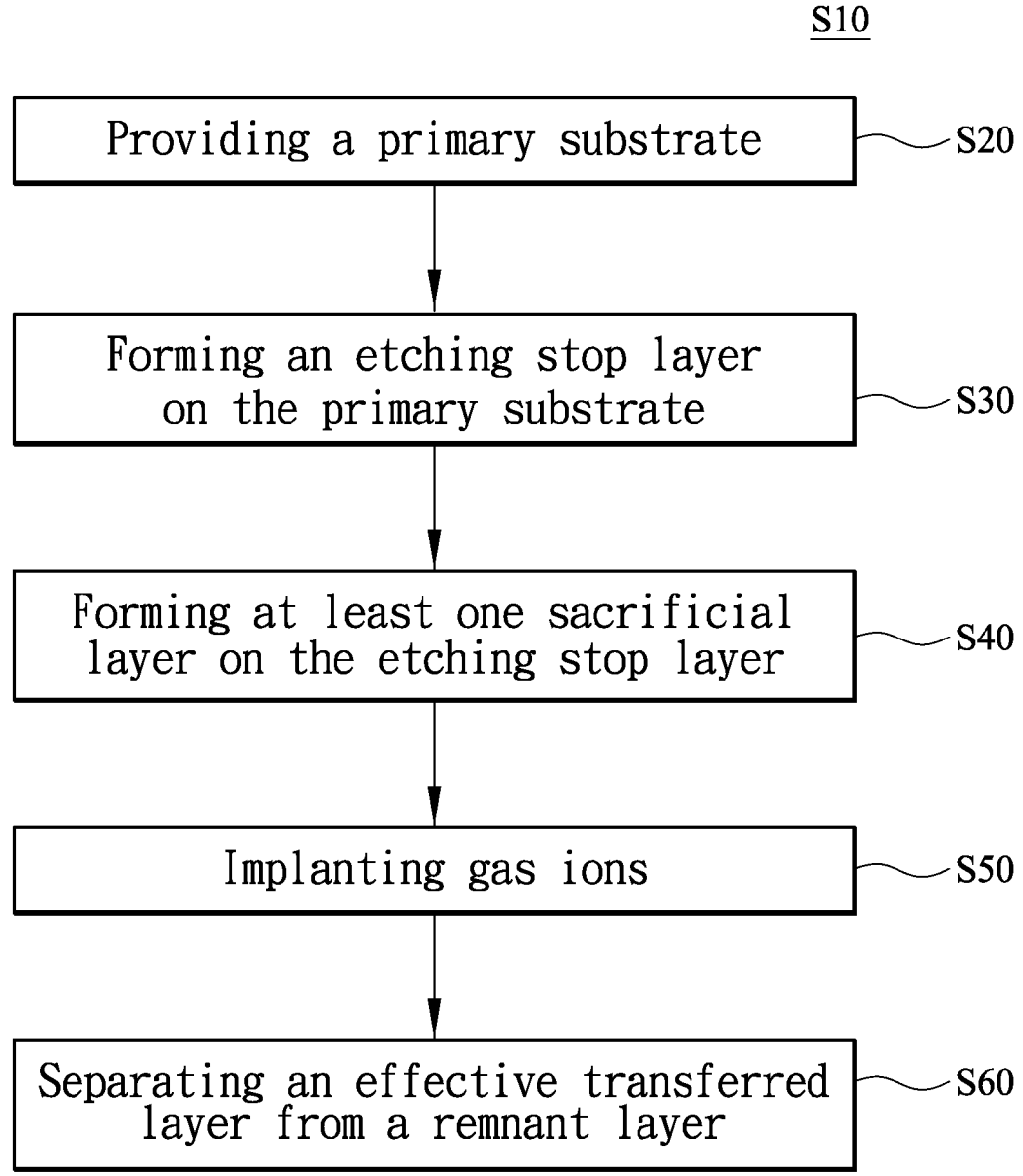
FIG. 1 is a flowchart of a method for producing a thin film according to the present invention.

Referring to FIG. 1, a method S10 for producing a thin film according to an embodiment of the present invention comprises the steps of: providing a primary substrate (S20); forming an etching stop layer on the primary substrate (S30); forming at least one sacrificial layer on the etching stop layer (S40); implanting gas ions (S50); and separating an effective transferred layer from a remnant layer (S60).

Figure 2A:
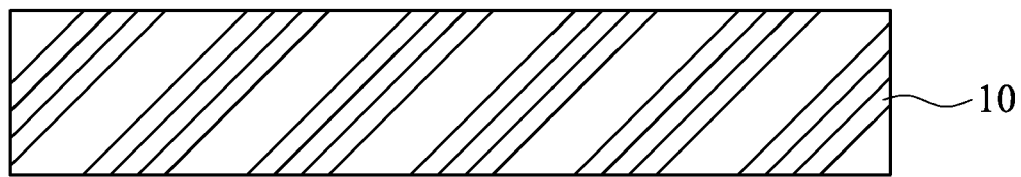
FIGS. 2A to 2F show different steps of the method shown in FIG. 1 for producing a thin film.

As shown in FIG. 2A, in the step of providing a primary substrate (S20), a primary substrate 10 made of an appropriate material is selected to suit the requirements of intended application. For example, the primary substrate 10 can be made of a Group IV element-based material. In that case, the primary substrate 10 can be a silicon (Si) substrate or a germanium (Ge) substrate. In addition, the primary substrate 10 can also be made of a Group III-V element-based material, so that the primary substrate 10 can be a gallium arsenide (GaAs) substrate, an indium phosphide (InP) substrate, a gallium phosphide (GaP) substrate, an aluminum nitride (AlN) substrate or a gallium nitride (GaN) substrate. Furthermore, the primary substrate 10 can also be made of a Group II-VI element-based material or be a sulfide substrate, so that the primary substrate 10 can be a selenium sulfide (SeS) substrate or a cadmium sulfide (CdS) substrate. Or alternatively, the primary substrate 10 can be a silicon carbide (SiC) substrate.

Figure 2B:
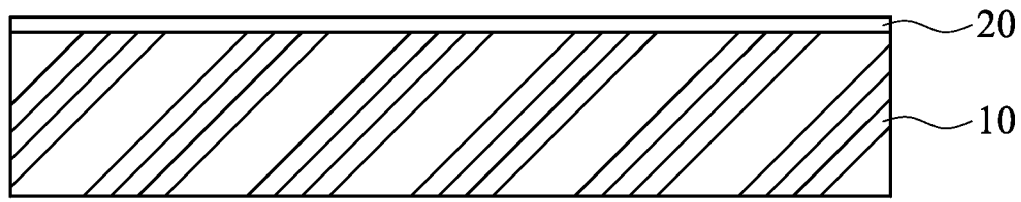

Referring to FIG. 2B, in the step of forming an etching stop layer on the primary substrate (S30), a thin film growing technique can be used to form an etching stop layer 20 on the primary substrate 10, wherein the etching stop layer 20 can be an insulating layer. Besides, the etching stop layer 20 can be made of an oxide material, a nitride material or a carbon-based diamond material. When an alkaline or organic solution is used to remove a sacrificial layer, as explained below, the etching stop layer 20 is unlikely to be etched by the alkaline or organic solution and is therefore capable of preventing the primary substrate 10 from being etched.

Figure 2C:
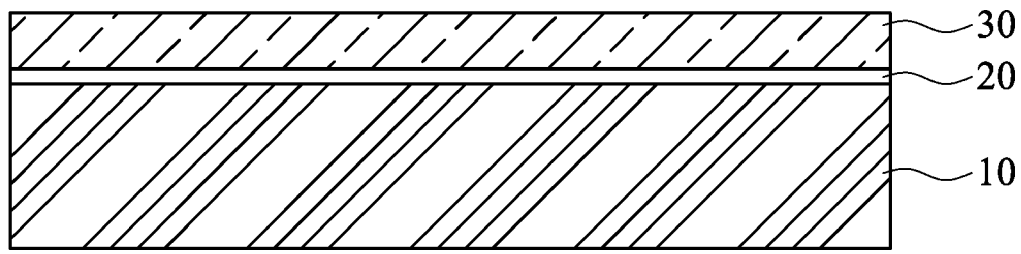

Referring to FIG. 2C, in the step of forming at least one sacrificial layer on the etching stop layer (S40), a sacrificial layer 30 can be formed on the etching stop layer 20 by using a chemical vapor deposition (CVD) technique, a physical vapor deposition (PVD) technique, a molecule beam epitaxy (MBE) technique, a liquid-phase epitaxy (LPE) technique, a vapor-phase epitaxy (VPE) technique or similar techniques. The sacrificial layer 30 can be formed of amorphous materials, poly-crystalline materials, mono-crystalline materials or a combination thereof. For example, the sacrificial layer 30 can be formed of amorphous silicon, polycrystalline silicon or monocrystalline silicon. Alternatively, the sacrificial layer 30 can also be a silicon monoxide layer or a silicon dioxide layer. Where there are two or more than two sacrificial layers 30, each of the sacrificial layers 30 can be composed of the same element or different elements.

Figure 2D:
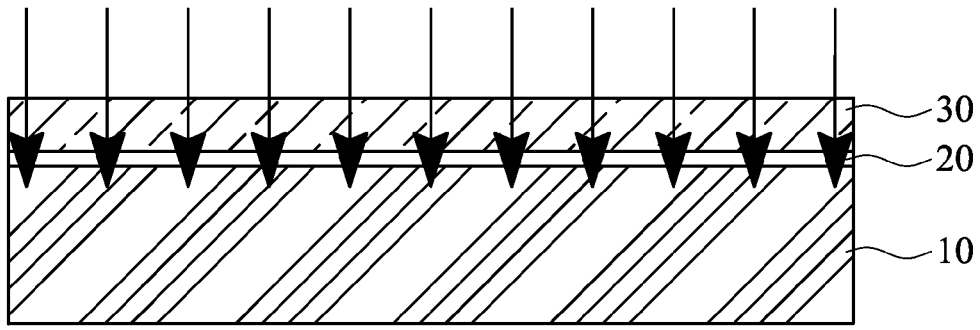

In the step of implanting gas ions (S50), as shown in FIG. 2D, gas ions are implanted by using an ion implantation technique such as a plasma ion implantation immersion technology or an ion shower doping technique. The ions implanted can be hydrogen ions ($H^+$), molecular ions or a combination thereof, wherein the molecular ions can include hydrogen molecular ions ($H_2^+$). Gas ion implantation can be performed at temperatures characterized by temperature gradation.

Figure 2E:
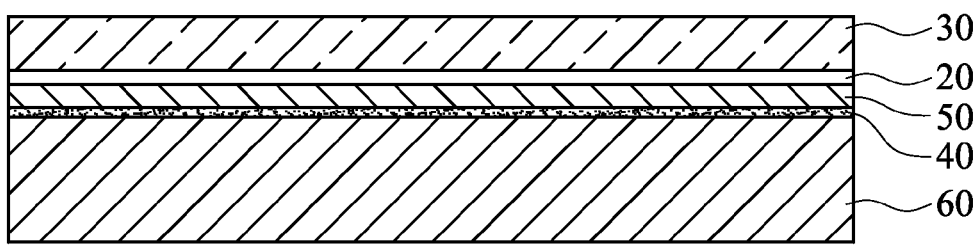

As shown in FIG. 2E, the ions implanted with the ion implantation technique can penetrate the sacrificial layer 30 and the etching stop layer 20, enter the primary substrate 10 and, by virtue of an ion implantation concentration of the implanted gas ions, form an ion implantation peak layer 40, which defines an effective transferred layer 50 and a remnant layer 60. A thickness of the sacrificial layer 30 can be increased, so that the ion implantation peak layer 40 is located at a shallower position in the primary substrate 10, thereby defining a relatively thin effective transferred layer 50.

Ion implantation depth can be accurately controlled by controlling ion implantation energy, thereby allowing a thickness of the effective transferred layer 50 to be accurately controlled at nanoscale. Besides, the thickness of the sacrificial layer 30 can also be accurately controlled at nanoscale by using an epitaxy technique. Thus, the thickness of the effective transferred layer 50 can be properly determined by controlling the thickness of the sacrificial layer 30 and ion implantation energy. For example, when hydrogen ions ($H^+$) are implanted into the primary substrate 10 at a dose of $10^{17}$ ions/cm$^2$ with an ion implantation energy of 80 KeV, the implanted ions can form a hydrogen ion implantation peak layer approximately 700 nm below a surface of the primary substrate 10. In other words, the thickness of the effective transferred layer 50 can be controllably set to about 700 nm.

Furthermore, since the sacrificial layer 30 can be formed of amorphous silicon or polycrystalline silicon, when the ions penetrate the sacrificial layer 30, the sacrificial layer 30 also serves a function similar to filtering, so that the ion implantation energy is evenly distributed, thereby decreasing coarseness of the effective transferred layer 50. The sacrificial layer 30 can also eliminate a channeling effect when the gas ions are implanted with the ion implantation technique, allowing the implanted ions to have a uniform ion concentration and be evenly implanted into the same plane. Thus, when subsequently separated, the effective transferred layer 50 will be sufficiently flat and smooth.

Also, the sacrificial layer 30 can filter out impurity ions in the implanted ions, so that a very thin effective transferred layer 50 can be produced by a relatively simple ion implantation device, instead of a sophisticated and more expensive ion implantation device, thereby lowering the production cost considerably.

Figure 2F:
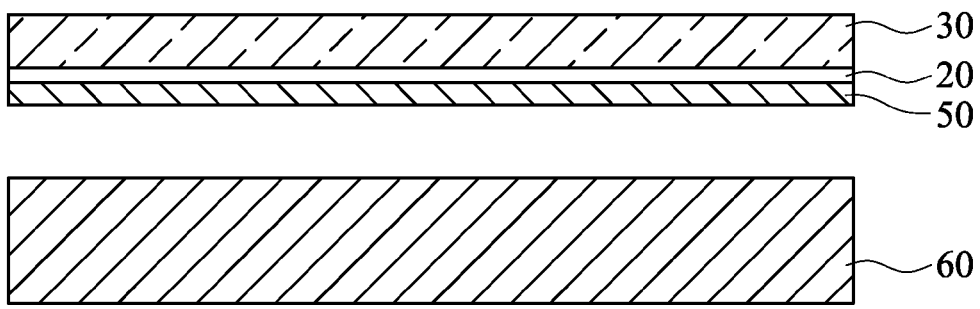

Referring now to FIG. 2F, in the step of separating an effective transferred layer from a remnant layer (S60), an energy input treatment is applied to polymerize the ions in the ion implantation peak layer 40 and ions scattering thereabout. Since the implanted ions are gas ions, they can form gas nuclei when polymerized, and coalesce gas generated by other implanted gas ions. The latter gas is filled in the gas nuclei formed by the gas ions, thereby expanding and fracturing a surrounding solid structure. As a result, the effective transferred layer 50 is separated smoothly from the remnant layer 60.

The energy input treatment can be a high frequency alternating electric field treatment or a magnetic field radiation treatment. The high frequency alternating electric field treatment or the magnetic field radiation treatment can be applied by a microwave generating device, a radio frequency generating device or an inductive coupled field generating device. In addition, the energy input treatment can also be a thermal treatment, whose temperature can be higher than room temperature and lower than 1250° C.

Furthermore, the high frequency alternating electric field treatment or magnetic field radiation treatment can use a microwave generating device such as a fixed-frequency microwave generating device or a variable-frequency microwave generating device, wherein the fixed-frequency microwave generating device can use microwave having a frequency of 2.45 GHz or 900 MHz, and a microwave radiation time of the microwave generating device can be longer than one minute.

Figure 3:
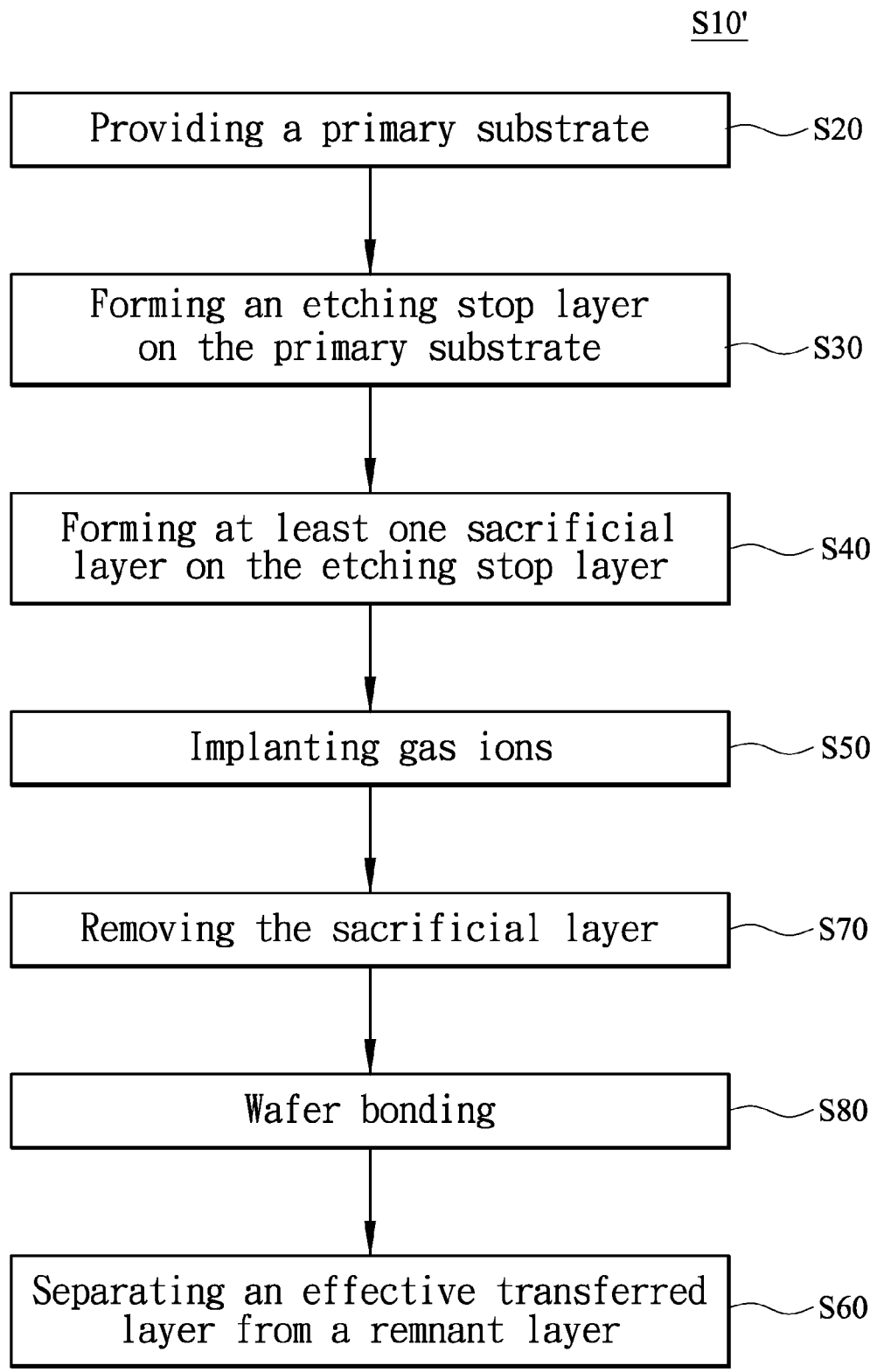
FIG. 3 is a flowchart of another method for producing a thin film according to the present invention.

Referring now to FIG. 3, a method S10' for producing a thin film according to another embodiment of the present invention further comprises a step of removing the sacrificial layer (S70) and a step of wafer bonding (S80), which two steps are performed between the step of implanting gas ions (S50) and the step of separating an effective transferred layer from a remnant layer (S60).

Figure 4A:
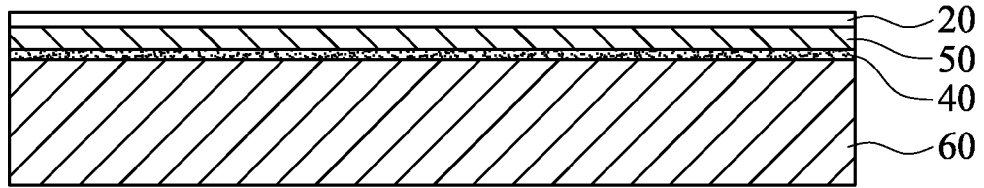
FIGS. 4A to 4C show different steps of the method in FIG. 3 for producing a thin film.

As shown in FIG. 4A, in the step of removing the sacrificial layer (S70), the sacrificial layer 30 in FIG. 2E can be removed by an etching treatment, such as a chemical solution etching treatment or an ion plasma etching treatment. For example, the sacrificial layer 30 can be removed with an alkaline or organic solution, including such standard etching solutions as potassium hydroxide (KOH), tetramethyl ammonium hydroxide (TMAH) or ethylene diamine pyrocatechol (EDP).

Figure 4B:
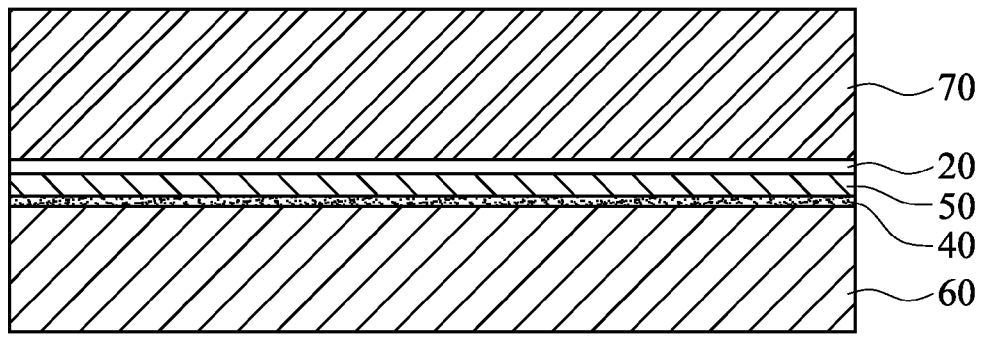

In the step of wafer bonding (S80), as shown in FIG. 4B, the etching stop layer 20 can be bonded to a target substrate 70 with a wafer bonding technique, such as a direct bonding technique, an anode bonding technique, a low-temperature bonding technique, a vacuum bonding technique or a plasma-enhanced bonding technique. The step of wafer bonding (S80) can further comprise a surface ionization treatment for increasing bond strength between the etching stop layer 20 and the target substrate 70.

Figure 4C:
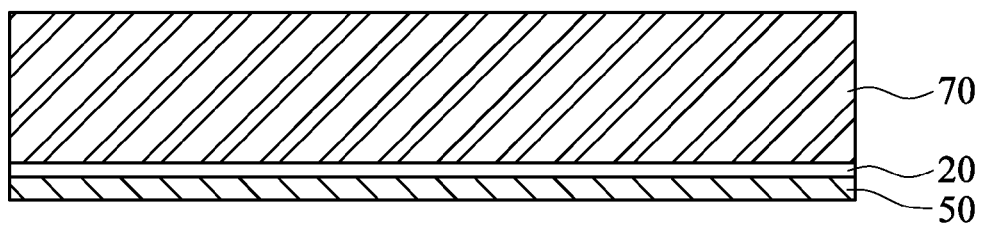
Figure 4C:
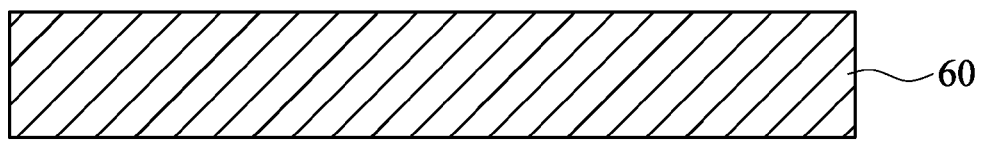

Then, as shown in FIG. 4C, the step of separating an effective transferred layer from a remnant layer (S60) is performed to separate the effective transferred layer 50 smoothly from the remnant layer 60, so that the etching stop layer 20 and the effective transferred layer 50 are successfully transferred to the target substrate 70.

Moreover, the step of wafer bonding (S80) can further comprise a step of pre-heating for raising temperatures of the etching stop layer 20, the effective transferred layer 50, the ion implantation peak layer 40 and the remnant layer 60, thereby shorting the time required for separating the effective transferred layer 50 from the remnant layer 60. For example, if the energy input treatment is a thermal treatment performed at a temperature above 500° C., it takes at least 30 minutes to separate the effective transferred layer 50 from the remnant layer 60. However, if the step of pre-heating is performed at 300° C. for one hour before bonding the etching stop layer 20 to the target substrate 70, it takes only ten minutes to separate the effective transferred layer 50 from the remnant layer 60 at 500° C.

Figure 5:
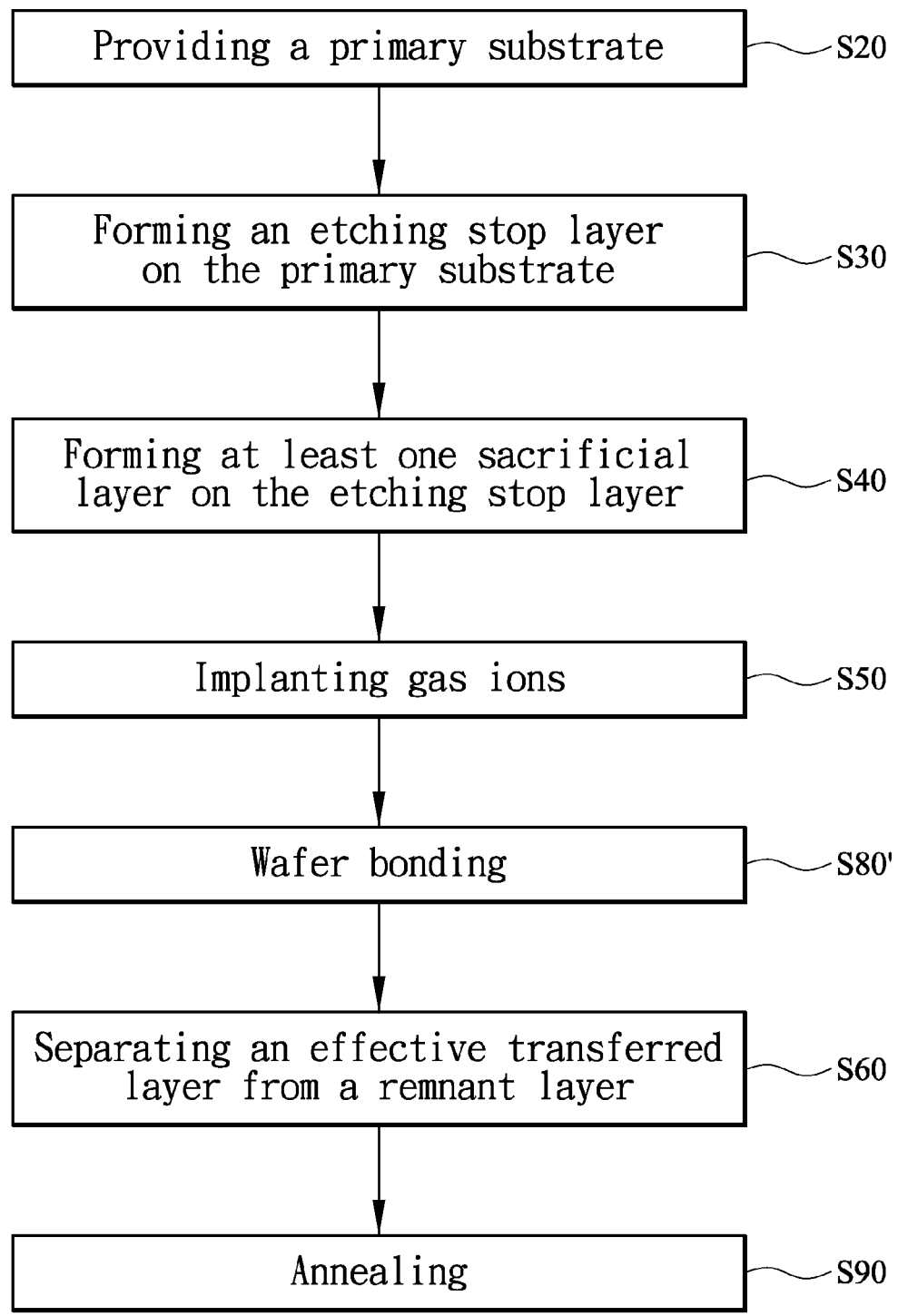
FIG. 5 is a flowchart of yet another method for producing a thin film according to the present invention.

Referring to FIG. 5, a method S10" for producing a thin film according to yet another embodiment of the present invention further comprises a step of wafer bonding (S80') and a step of annealing (S90), wherein the step of wafer bonding (S80') is performed between the step of implanting gas ions (S50) and the step of separating an effective transferred layer from an remnant layer (S60), and the step of annealing (S90) follows the step of separating an effective transferred layer from an remnant layer (S60).

Figure 6A:
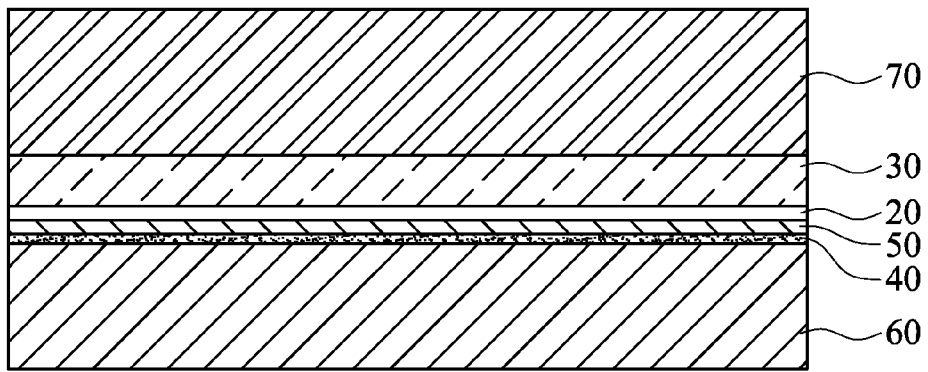
FIGS. 6A and 6C show different steps of the method in FIG. 5 for producing a thin film.

As shown in FIG. 6A, in the step of wafer bonding (S80'), the sacrificial layer 30 can be bonded to the target substrate 70 with a wafer bonding technique, such as a direct bonding technique, an anode bonding technique, a low-temperature bonding technique, a vacuum bonding technique or a plasma-enhanced bonding technique. The step of wafer bonding (S80') can further comprise a surface ionization treatment for increasing a wafer bonding strength. Similarly, the step of wafer bonding (S80') can also comprise an additional step of pre-heating for raising temperatures of the sacrificial layer 30, the etching stop layer 20, the effective transferred layer 50, the ion implantation peak layer 40 and the remnant layer 60, thereby shorting the time required for separating the effective transferred layer 50 from the remnant layer 60.

Figure 6B:
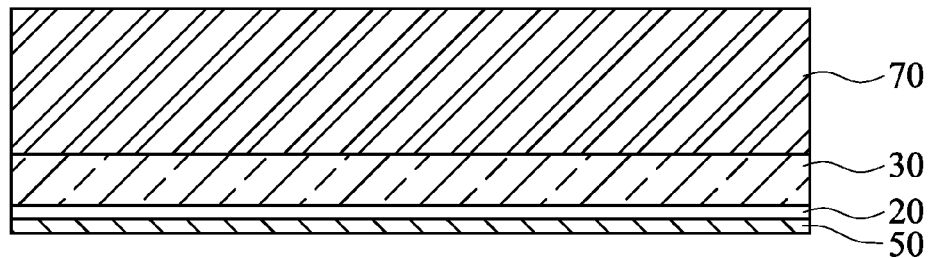
Figure 6B:
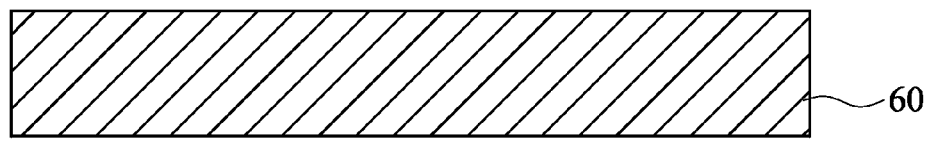

Then, as shown in FIG. 6B, the step of separating an effective transferred layer from a remnant layer (S60) is performed to separate the effective transferred layer 50 smoothly from the remnant layer 60, so that the sacrificial layer 30, the etching stop layer 20 and the effective transferred layer 50 are transferred successfully to the target substrate 70.

Figure 6C:
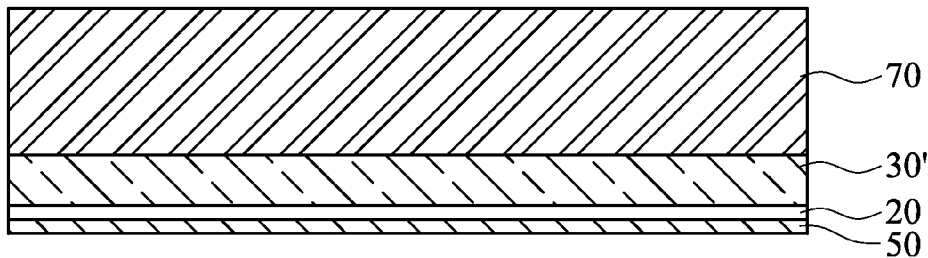

Referring to FIG. 6C, in the step of annealing (S90), the sacrificial layer 30 is recrystallized by annealing to improve its crystal structure, so that the crystal structure of the sacrificial layer 30 approximates to a crystal structure of the target substrate 70. After the step of annealing (S90), the sacrificial layer 30 which has been transferred to the target substrate 70 is recrystallized to form a sacrificial layer 30' having an improved crystal structure, thereby enhancing a matching level of crystal lattices between the sacrificial layer 30' and the target substrate 70.

In the methods described above according to the embodiments of the present invention, a thin film growing technique is used to accurately control the thickness of the sacrificial layer 30 at nanoscale, so that the ion implantation energy can be controlled with the thickness of the sacrificial layer 30, allowing the ion implantation peak layer 40 to be located at a shallower position, whereby the effective transferred layer 50 is defined with a nanoscale thickness. The sacrificial layer 30 can be removed by chemical etching before the step of wafer bonding (S80). Alternatively, the sacrificial layer 30 can be preserved and treated with the step of annealing (S90) after the sacrificial layer 30, the etching stop layer 20 and the effective transferred layer 50 are transferred to the target substrate 70, so that the matching level of crystal lattices between the resulting sacrificial layer 30' and the target substrate 70 is improved.

Presented below are several preferred embodiments of the present invention to further demonstrate the framework and features of the disclosed method, so that the effects thereof can be more readily understood.

First Preferred Embodiment

Figure 7:
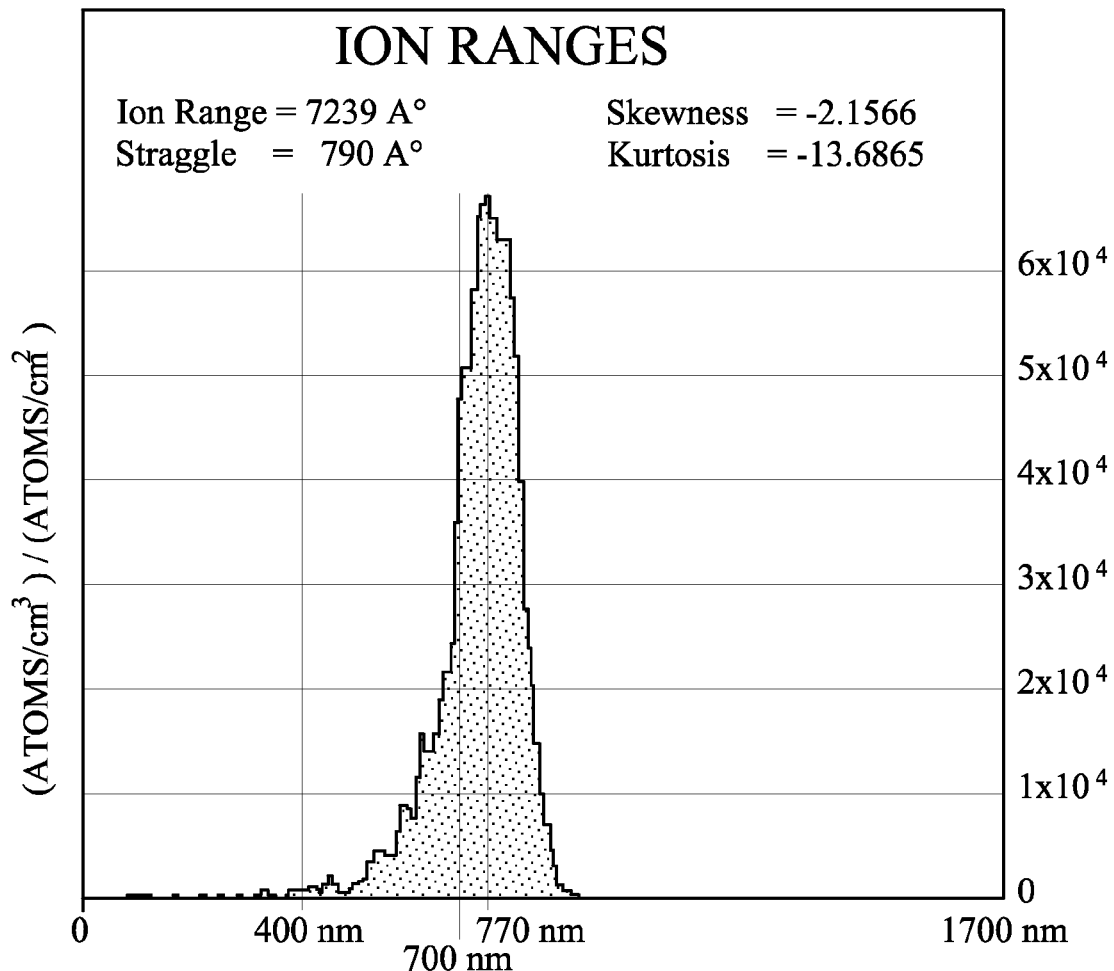
FIG. 7 is a plot showing ion implantation energy plotted against ion implantation depth.

In a first preferred embodiment of the present invention, the primary substrate 10 is a primary silicon wafer, the etching stop layer 20 is a silicon dioxide layer, the sacrificial layer 30 is a polycrystalline silicon sacrificial layer and hydrogen ion implantation is performed, as explained in more detail below. FIG. 7 is a plot showing an ion implantation depth distribution plotted against a certain range of implantation energy as calculated by a SRIM™ program. With this drawing, a thickness of a monocrystalline silicon layer transferred from the primary silicon wafer can be estimated.

As shown in FIG. 7, a peak value of hydrogen ion concentration occurs at a depth of approximately 730 to 810 nm when a hydrogen ion implantation energy is set at 160 KeV, an inclination angle for implantation is 7°, the silicon dioxide layer is 300 nm thick and the polycrystalline silicon sacrificial layer is 400 nm thick. Therefore, it can be inferred that the effective transferred layer 50 defined by the ion implantation peak layer 40 is approximately 30 to 110 nm thick.

After hydrogen ion implantation, the polycrystalline silicon sacrificial layer can be removed with an alkaline or organic solution, including such popular anisotropic etching solutions as potassium hydroxide (KOH), tetramethyl ammonium hydroxide (TMAH) or ethylene diamine pyrocatechol (EDP). Generally speaking, TMAH is a more popular choice as the etching solution for removing the polycrystalline silicon sacrificial layer because TMAH is a colorless and non-toxic organic solvent. In addition, TMAH is highly compatible with the manufacturing process of complementary metal-oxide-semiconductor (CMOS) and advantageously less corrosive to silicon dioxide and silicon nitride.

After the polycrystalline silicon sacrificial layer is removed with a TMAH solution, a surface coarseness of 0.586 nm is measured with an atomic force microscope (AFM). The measurement confirms that the quality of wafer bonding is not seriously affected after etching. Moreover, an ellipsometer is used to measure a thickness of a transferred monocrystalline silicon layer and a thickness of the silicon dioxide layer. It is found that the transferred monocrystalline silicon layer is about 97 nm thick and the silicon dioxide layer is about 313 nm thick.

Figure 8:
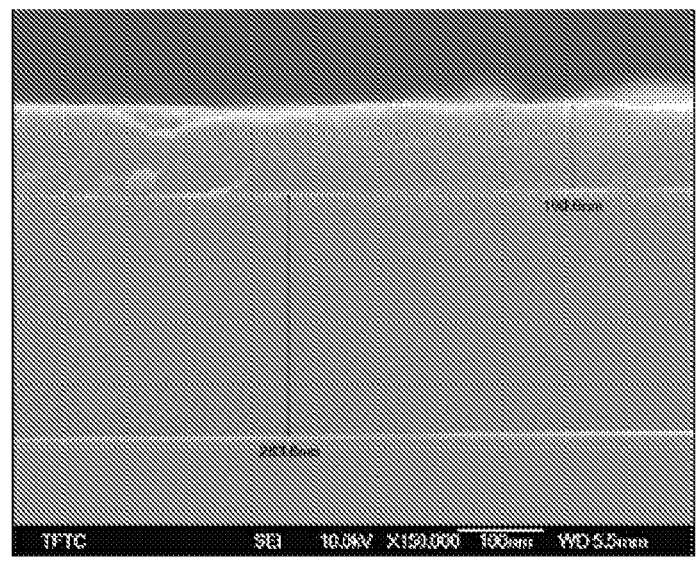
FIG. 8 is a picture taken by a field-emission scanning electron microscope, showing a cross section of a monocrystalline silicon layer.
Figure 9:
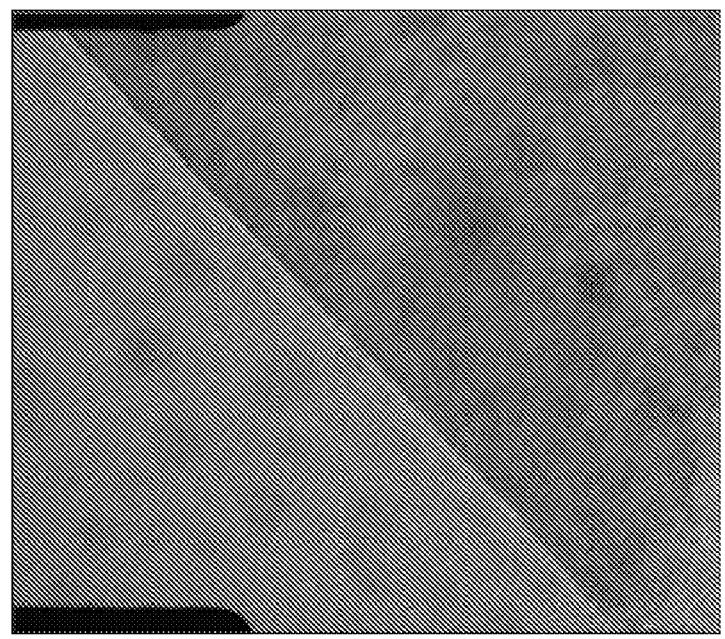
FIG. 9 is a picture taken by a transmission electron microscope, showing a cross section of a monocrystalline silicon layer.

As shown in FIG. 8, an upper monocrystalline silicon layer is approximately 100.6 nm thick while a silicon dioxide layer is 283.8 nm thick. As shown in FIG. 9, a bonding interface is quite smooth and uniform, and free of any unbonded regions. The results shown in FIGS. 8 and 9 are similar to those simulated by SRIM™, meaning that film separation does take place where the hydrogen ion concentration is the highest.

Figure 10:
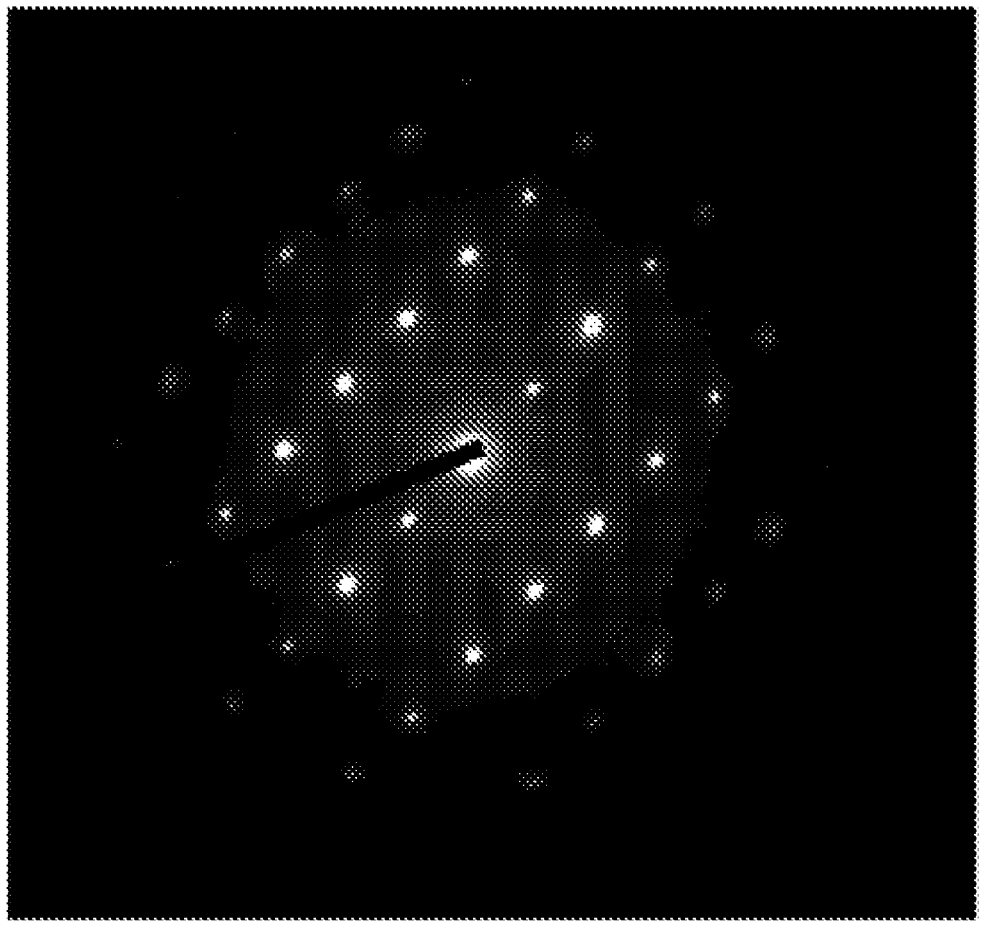
FIG. 10 shows an X-ray energy dispersive spectrum of a monocrystalline silicon layer.

FIG. 10 shows that the silicon on top of the silicon dioxide layer in FIG. 8 is monocrystalline silicon having a <100> crystal orientation. When a polycrystalline silicon sacrificial layer is used as the sacrificial layer 30, the polycrystalline silicon sacrificial layer can function as an effective ion implantation barrier layer which prevents ion implantation depths from varying during ion implantation due to crystal lattice arrangement. Thus, a smoother and low-coarseness (with Ra of about 1.3 nm) cleavage plane can be obtained.

Besides, when gas ions are implanted by using a plasma ion implantation immersion technology, the polycrystalline silicon sacrificial layer can effectively detain implanted impurity ions inside the polycrystalline silicon sacrificial layer. Therefore, when the polycrystalline silicon sacrificial layer is removed, the impurity ions filtered out are also removed and prevented from entering the primary substrate 10, thereby allowing the use of relatively simple ion implantation equipment.

Second Preferred Embodiment

In a second preferred embodiment of the present invention, two p-type silicon wafers having a <100> crystal orientation and a resistivity of 15 to 20 ohm-cm are provided, one of which is used as the primary substrate 10. Before ion implantation, a thermal oxidization method is used to grow an oxidized layer having a thickness of 300 nm on the primary substrate 10 as the etching stop layer 20. Then, the sacrificial layer 30 is formed by depositing a layer of polycrystalline silicon having a thickness of 400 nm on the oxidized layer by using a liquid-phase epitaxy technique. Next, hydrogen molecular ions ($H_2$) are implanted at a dose of $4 \times 10^{16}$ ions/$cm^2$ with an ion implantation energy of 160 KeV. Before wafer bonding, the polycrystalline silicon is removed by chemical etching with TMAH, leaving the 300 nm-thick oxidized layer on the primary substrate 10 which has been implanted with hydrogen molecular ions.

After wafer bonding, low-temperature annealing is applied to increase bond energy. Then, following ten-minute microwave radiation at 900 W, a monocrystalline silicon layer having a thickness of about 100 nm and a silicon dioxide layer having a thickness of 300 nm are transferred to the other silicon wafer.

Third Preferred Embodiment

In a third preferred embodiment of the present invention, two p-type silicon wafers having a <100> crystal orientation and a resistivity of 15 to 20 ohm-cm are provided, one of which is used as the primary substrate 10. A wet oxidization method is used to grow a 300 nm-thick layer of silicon dioxide on the primary substrate 10 as the etching stop layer 20. Then, a 400 nm-thick undoped polycrystalline silicon layer is deposited as the sacrificial layer 30 by using a low-pressure chemical vapor deposition technique. Following that, hydrogen gas ions are implanted into the primary substrate 10 at a dose of $4\times10^{16}$ ions/cm$^2$ with an ion implantation energy of 160 KeV. After ion implantation, the polycrystalline silicon layer is removed with a TMAH solution, and an exposed surface is cleaned with an RCA solution. Then, the primary substrate 10 is directly bonded with the other silicon wafer by using a wafer bonding technique. After ten-minute microwave radiation, a monocrystalline silicon layer having a thickness of about 100 nm and a silicon dioxide layer having a thickness of 300 nm are transferred to the other silicon wafer.

Fourth Preferred Embodiment

In a fourth preferred embodiment of the present invention, two p-type silicon wafers having a <100> crystal orientation and a resistivity of 15 to 20 ohm-cm are provided, one of which is used as the primary substrate 10. Before ion implantation, a thermal oxidization method is used to grow an oxidized layer having a thickness of 300 nm on the primary substrate 10. Then, the sacrificial layer 30 is formed by depositing a polycrystalline silicon layer having a thickness of 400 nm on the oxidized layer by using a liquid-phase epitaxy technique. Next, hydrogen molecular ions ($H_2^+$) are implanted at a dose of $4\times10^{16}$ ions/cm$^2$ with an ion implantation energy of 160 KeV.

Before wafer bonding, the polycrystalline silicon is preserved and not removed. After wafer bonding, low-temperature annealing is applied to increase bond energy. Then, following microwave radiation at 900 W for ten minutes, a monocrystalline silicon layer having a thickness of about 100 nm, a silicon dioxide layer having a thickness of 300 nm and the polycrystalline silicon layer having a thickness of 400 nm are transferred to the other silicon wafer. The other silicon wafer is subsequently treated with an appropriate high-temperature annealing process to recrystallize the polycrystalline silicon, thereby generating a better monocrystalline structure, so that a matching level of crystal lattices between the polycrystalline silicon layer and the other silicon wafer is improved.

The various embodiments described above are provided to demonstrate features of the present invention, thereby enabling a person skilled in the art to understand and carry out the contents disclosed herein. These embodiments, however, are not intended to limit the scope of the present invention. Therefore, all equivalent changes or modifications which do not depart from the spirit of the present invention should be encompassed by the appended claims.

What is claimed is:

1. A method for producing a thin film, comprising steps of:
providing a primary substrate;
forming an etching stop layer on the primary substrate;
forming at least one sacrificial layer on the etching stop layer;
implanting gas ions with an ion implantation technique, so that the gas ions are implanted through the sacrificial layer and then through the etching stop layer, so that an ion implantation peak layer is formed in the primary substrate, thereby defining an effective transferred layer and a remnant layer, with a thickness of the effective transferred layer determined by a thickness of the sacrificial layer and an ion implantation energy used in the ion implantation technique;
removing the sacrificial layer with one of an etching treatment, a chemical solution etching treatment, and an ion plasma etching treatment; and
separating the effective transferred layer from the remnant layer by applying an energy input treatment to polymerize the implanted gas ions.

2. The method of claim 1, wherein the primary substrate is made of one of a Group IV element-based material, a Group III-V element-based material, and a Group II-VI element-based material.

3. The method of claim 1, wherein the primary substrate is one of a silicon substrate, a germanium substrate, a silicon carbide substrate, a gallium arsenide substrate, an indium phosphide substrate, a gallium phosphide substrate, an aluminum nitride substrate, a gallium nitride substrate, and a sulfide substrate.

4. The method of claim 1, wherein the etching stop layer is an insulating layer.

5. The method of claim 1, wherein the etching stop layer is made of one of an oxide material, a nitride material, and a carbon-based diamond material.

6. The method of claim 1, wherein the sacrificial layer is formed by using one of a chemical vapor deposition technique, a physical vapor deposition technique, a molecule beam epitaxy technique, a liquid-phase epitaxy technique, and a vapor-phase epitaxy technique.

7. The method of claim 1, wherein the sacrificial layer is one of amorphous silicon, polycrystalline silicon, monocrystalline silicon, a silicon monoxide layer, and a silicon dioxide layer.

8. The method of claim 1, wherein the sacrificial layer has at least two layers composed of a same element or different elements.

9. The method of claim 1, further comprising a step of wafer bonding for bonding the etching stop layer to a target substrate.

10. The method of claim 9, wherein the step of wafer bonding further comprises a surface ionization treatment.

11. The method of claim 9, wherein the step of wafer bonding further comprises a step of pre-heating.

12. The method of claim 1, wherein the ion implantation technique is one of a plasma ion implantation immersion technology and an ion shower doping technique.

13. The method of claim 1, wherein the ions implanted with the ion implantation technique are one of hydrogen ions ($H^+$) and molecular ions.

14. The method of claim 13, wherein the molecular ions include hydrogen molecular ions ($H_2^+$).

15. The method of claim 1, wherein the energy input treatment is one of a high frequency alternating electric field treatment and a magnetic field radiation treatment.

16. The method of claim 15, wherein the high frequency alternating electric field treatment or the magnetic field radiation treatment is applied by one of a microwave generating device, a radio frequency generating device, and an inductive coupled field generating device.

17. The method of claim 16, wherein the high frequency alternating electric field treatment or the magnetic field radiation treatment uses the microwave generating device selected from the group consisting of a fixed-frequency microwave generating device and a variable-frequency microwave generating device, wherein the fixed-frequency microwave generating device uses microwaves having a frequency of one of 2.45 GHz and 900 MHz.

18. The method of claim 17, wherein the microwave generating device uses a microwave radiation time longer than one minute.

19. The method of claim 1, wherein the energy input treatment is a thermal treatment.

20. The method of claim 19, wherein the thermal treatment uses a temperature higher than a room temperature and lower than 1250° C.

* * * * *